(12) United States Patent
Annema et al.

(10) Patent No.: US 6,304,112 B1
(45) Date of Patent: Oct. 16, 2001

(54) INTEGRATED CIRCUIT PROVIDED WITH A FAIL-SAFE MODE

(75) Inventors: Anne Johan Annema; Godefridus Johannes Gertrudis Maria Geelen, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/635,115

(22) Filed: Aug. 9, 2000

(30) Foreign Application Priority Data

Aug. 10, 1999 (EP) .................................................. 99202611

(51) Int. Cl.$^7$ ........................... H03K 3/00; H03K 19/007

(52) U.S. Cl. ............................................... 327/112; 326/14
(58) Field of Search ..................................... 327/108, 112, 327/379, 383, 384, 389, 391, 427, 434, 437; 326/83, 85, 14

(56) References Cited

U.S. PATENT DOCUMENTS 4,884,165 * 11/1989 Kong et al. .............................. 361/98
5,959,472 * 9/1999 Nagamatsu et al. .................. 327/108
5,969,926 * 10/1999 Whitaker ............................... 361/101

* cited by examiner

*Primary Examiner*—My-Trang Nu Ton
(74) *Attorney, Agent, or Firm*—Steven R. Biren

(57) ABSTRACT

An integrated circuit provided with an improved fail-safe mode.

1 Claim, 2 Drawing Sheets

INTEGRATED CIRCUIT PROVIDED WITH A FAIL-SAFE MODE

BACKGROUND OF THE INVENTION

The invention relates to an integrated circuit comprising a first supply voltage bondpad; a second supply voltage bondpad; a combined input/output bondpad; an output driving stage for supplying a digital output signal comprising a first transistor and a second transistor, the first transistor having a first main terminal coupled to the second supply voltage bondpad, a second main terminal, and a control terminal, the second transistor having a first main terminal coupled to the second main terminal of the first transistor, a second main terminal coupled to the combined input/output bondpad, and a control terminal; a further output driving stage coupled between the combined input/output bondpad and the first supply voltage bondpad; and a pre-drive circuit for receiving a digital input signal and for supplying a first voltage to the control terminal of the first transistor, a second voltage to the control terminal of the second transistor, and a third voltage to a control terminal of the further output driving stage.

Such an integrated circuit is known from the general state of the art as shown in FIG. 1.

A problem of the known integrated circuit is that it has not a reliable fail-safe mode.

In a fail-safe mode of an integrated circuit, the power supply of said integrated circuit may be switched off while there is a relatively high voltage applied between the combined input/output bondpad and the first supply voltage bondpad. This situation can occur in systems where multiple integrated circuits are connected to a bus, or where multiple integrated circuits communicate with each. For these reasons it can occur that an integrated circuit is powered up and starts to try to communicate with other integrated circuits before one or more of the other integrated circuits are powered up. Thus it can occur that the voltage at the second supply voltage bondpad is for instance 0 Volt, as is indicated in FIG. 1B, instead of for example 5 Volt, as is indicated in FIG. 1A, while the voltage at the combined input/output bondpad is (for instance) 5 Volt, and the voltages at the control terminals of the first and the second transistors are respectively (for instance) 5 Volt and 2.5 Volt. Then in the situation of FIG. 1B the voltage at the common node formed by the drain of the first transistor and the source of the second transistor, is about 5 Volt (compared to $V_{SS}$). Thus both the voltage between the control terminal and the first main terminal of the first transistor and the voltage between the first main terminal and the second main terminal of the first transistor are 5 Volt. In a lot of modern IC-processes, especially in MOS-processes, these voltages would be too high and would seriously decrease the lifetime of the first transistor.

SUMMARY OF THE INVENTION

It is an object of the invention to provide an integrated circuit which does not have the problem of the known integrated circuit.

To this end, according to the invention, the integrated circuit of the type defined in the opening paragraph is characterized in that the integrated circuit further comprises a control circuit having a first input coupled to the second supply voltage bondpad, a second input coupled to the combined input/output bondpad, and an output for supplying a binary selection signal which is dependent on the voltage difference between the input and the output of the control circuit; and switching means for the coupling of either the first voltage to the control terminal of the first transistor and the coupling of the second voltage to the control terminal of the second transistor, or the coupling of the first voltage to the control terminal of the second transistor and the coupling of the second voltage to the control terminal of the first transistor, under command of the binary selection signal.

BRIEF DESCRIPTION OF THE DRAWING

The invention will be described in more detail with reference to the accompanying drawings, in which.

DESCRIPTION OF THE PREFERRED EMBODIMENTS

In these Figures parts or elements having like functions or purposes bear the same reference symbols.

Figure 2:
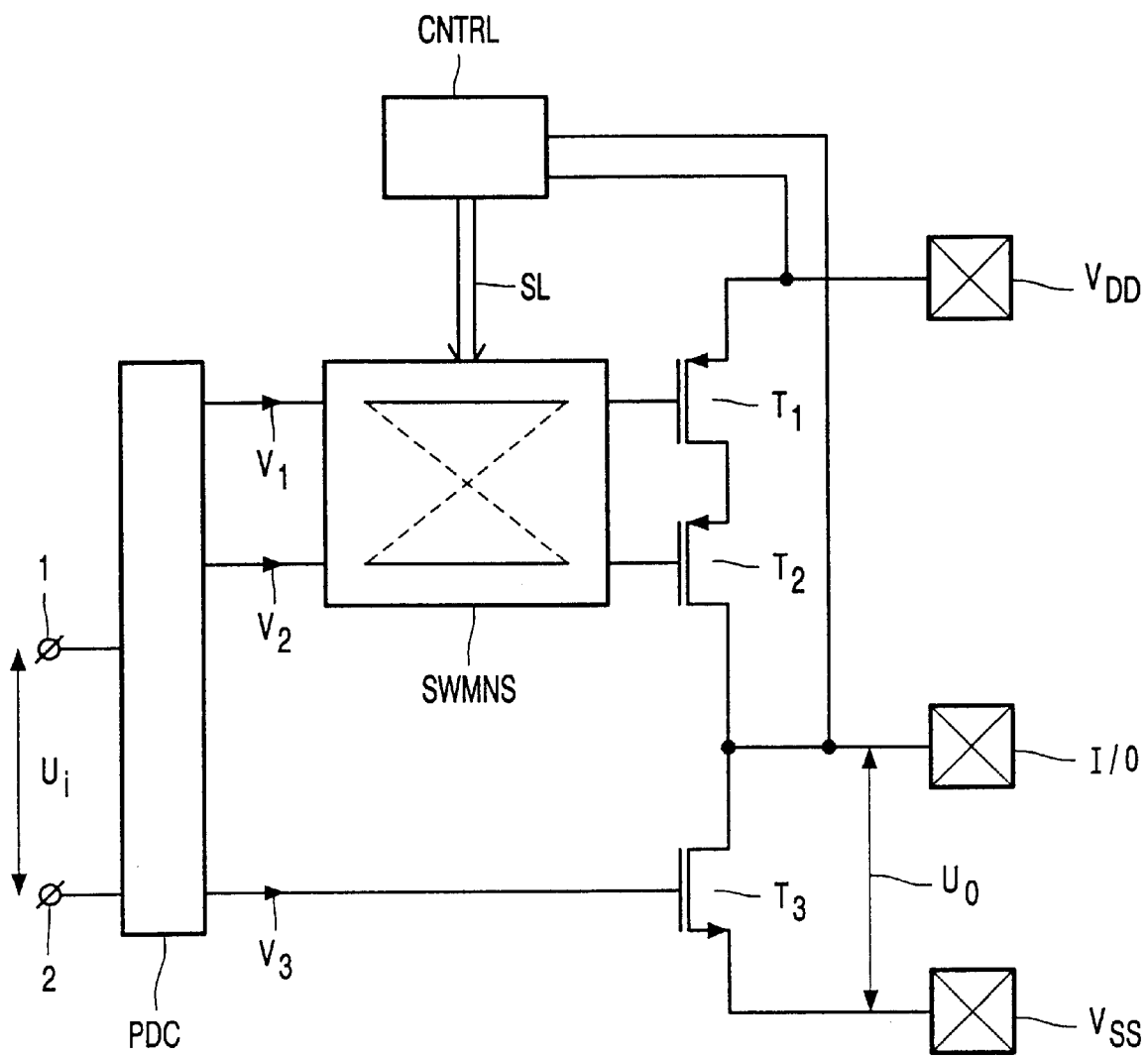
FIG. 2 is a circuit diagram of an embodiment of an integrated circuit according to the invention.

FIG. 2 shows a circuit diagram of an embodiment of an integrated circuit according to the invention. The integrated circuit comprises a first supply voltage bondpad $V_{SS}$; a second supply voltage bondpad $V_{DD}$; a combined input/output bondpad I/O; and an output driving stage for supplying a digital output signal $U_O$. The output driving stage comprises a first field effect transistor $T_1$ having a source connected to the second supply voltage bondpad $V_{DD}$, a drain, and a gate; and a second field effect transistor $T_2$ having a source connected to the drain of the first field effect transistor $T_1$, a drain coupled to the combined input/output bondpad I/O, and a gate. The integrated circuit further comprises a further output driving stage $T_3$ by way of example implemented by a third field effect transistor $T_3$ having a drain connected to the combined input/output bondpad I/O, a source connected to the first supply voltage bondpad $V_{SS}$, and a gate. The integrated circuit further comprises a pre-drive circuit PDC for receiving a digital input signal $U_i$ and for supplying a first voltage $V_1$, a second voltage $V_2$, and a third voltage $V_3$ which is coupled to the gate of the third field effect transistor $T_3$. The integrated circuit further comprises switching means SWMNS for the coupling of either the first voltage $V_1$ to the control terminal of the first transistor $T_1$ and the coupling of the second voltage $V_2$ to the control terminal of the second transistor $T_2$, or the coupling of the first voltage $V_1$ to the control terminal of the second transistor $T_2$ and the coupling of the second voltage $V_2$ to the control terminal of the first transistor $T_1$, under command of the binary selection signal SL. The integrated circuit further comprises a control circuit CNTLR having a first input connected to the second supply voltage bondpad $V_{DD}$, a second input connected to the combined input/output bondpad I/O, and an output for supplying the binary selection signal SL which is dependent on the voltage difference between the input and the output of the control circuit CNTRL.

The principle operation of the integrated circuit is as follows. It is by way of example assumed that a 5 Volt DC-voltage is supplied between the second supply voltage bondpad $V_{DD}$ and the first supply voltage bondpad $V_{SS}$. In that situation the state of the binary digital signal SL supplied by the control circuit CNTRL is such that the switching means SWMNS couples the first voltage $V_1$ to the gate of the first field effect transistor $T_1$ and the second voltage $V_2$ to the gate of the second field effect transistor $T_2$. This is a normal operation mode of the integrated circuit: the digital output signal $U_O$ is responsive to the digital input signal $U_i$.

Figure 1A:
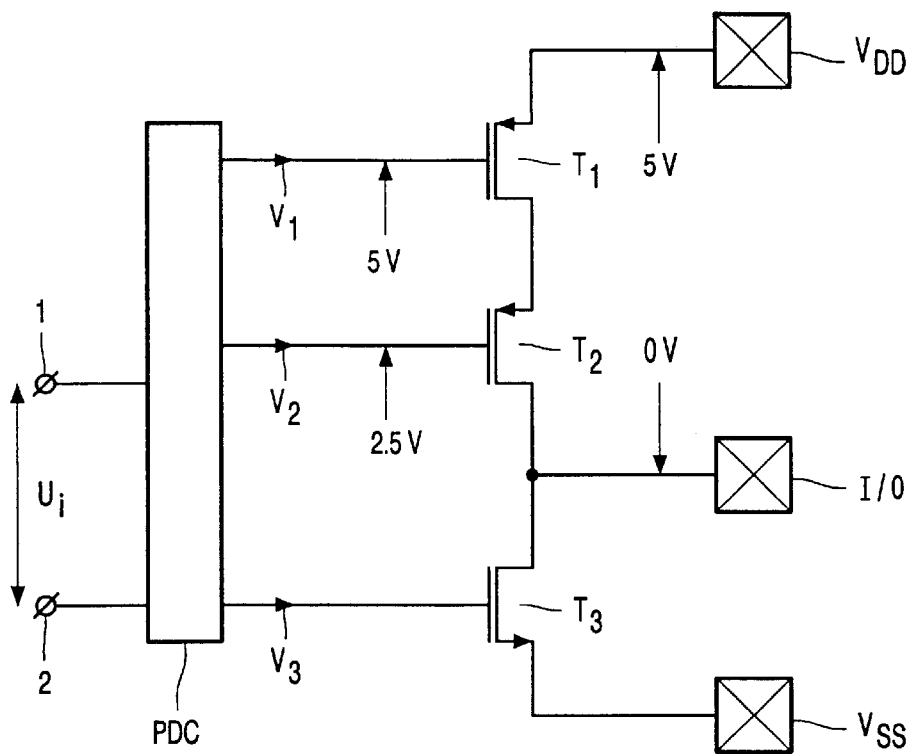
FIGS. 1A and 1B are a circuit diagram of a known integrated circuit.
Figure 1B:
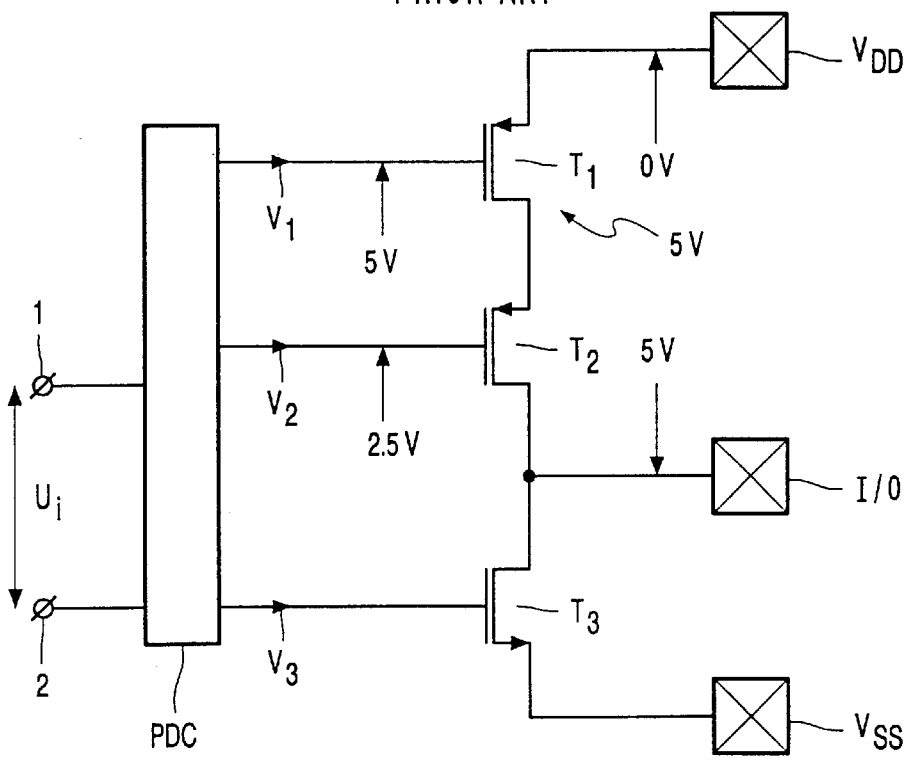

In a so-called fail-safe mode (power down) of the integrated circuit the DC-voltage supplied between the second supply voltage bondpad $V_{DD}$ and the first supply voltage bondpad $V_{SS}$ is virtually 0 Volt. In this situation the digital output signal $U_0$ is not responsive to the digital input signal $U_i$. In this fail-safe mode two situations can be further distinguished. In the first situation the voltage between the combined input/output bondpad I/O and the first supply voltage bondpad $V_{SS}$ is relatively low, for instance 0 Volt. This is not a problematic situation in the sense that no abnormal large gate-source voltages or drain-source voltages at the first and second field effect transistors $T_1$–$T_2$ exist. In the second situation the voltage between the combined input/output bondpad I/O and the first supply voltage bondpad $V_{SS}$ is relatively high, for instance 5 Volt. In an integrated circuit according to the prior art as shown in FIG. 1 this would lead to the problem that the gate-source voltages and the drain-source voltages at the first field effect transistor $T_1$ can be too high. This is indicated in FIG. 1B: both the gate-source voltage and the drain-source voltage of the first field effect transistor $T_1$ equals 5 Volt. However this is not the case in the embodiment of the invention as shown in FIG. 2. This is because in this situation due to the relatively high voltage between the combined input/output bondpad I/O and the first supply voltage bondpad $V_{SS}$, the binary signal SL has changed its state and as a consequence the switching means SWMNS couples the first voltage $V_1$ to the gate of the second field effect transistor $T_2$ and the second voltage $V_2$ to the gate of the first field effect transistor $T_1$. By so doing the gate-source voltages and the drain-source voltages at the first and second field effect transistors $T_1$–$T_2$ are never too high and thus a long lifetime of the first and second field effect transistors $T_1$–$T_2$ is guaranteed.

The switching means SWMNS can be implemented in various ways, for instance by pass-gates or logic-ports.

What is claimed is:

1. An integrated circuit comprising a first supply voltage bondpad ($V_{SS}$); a second supply voltage bondpad ($V_{DD}$); a combined input/output bondpad (I/O); an output driving stage for supplying a digital output signal ($U_0$) comprising a first transistor ($T_1$) and a second transistor ($T_2$), the first transistor ($T_1$) having a first main terminal coupled to the second supply voltage bondpad ($V_{DD}$), a second main terminal, and a control terminal, the second transistor ($T_2$) having a first main terminal coupled to the second main terminal of the first transistor ($T_1$), a second main terminal coupled to the combined input/output bondpad (I/O), and a control terminal; a further output driving stage ($T_3$) coupled between the combined input/output bondpad (I/O) and the first supply voltage bondpad ($V_{SS}$); and a pre-drive circuit (PDC) for receiving a digital input signal ($U_i$) and for supplying a first voltage ($V_1$) to the control terminal of the first transistor ($T_1$), a second voltage ($V_2$) to the control terminal of the second transistor ($T_2$), and a third voltage ($V_3$) to a control terminal of the further output driving stage ($T_3$), characterized in that the integrated circuit further comprises a control circuit (CNTLR) having a first input coupled to the second supply voltage bondpad ($V_{DD}$), a second input coupled to the combined input/output bondpad (I/O), and an output for supplying a binary selection signal (SL) which is dependent on the voltage difference between the input and the output of the control circuit (CNTRL); and switching means (SWMNS) for the coupling of either the first voltage ($V_1$) to the control terminal of the first transistor ($T_1$) and the coupling of the second voltage ($V_2$) to the control terminal of the second transistor ($T_2$) or the coupling of the first voltage ($V_1$) to the control terminal of the second transistor ($T_2$) and the coupling of the second voltage ($V_2$) to the control terminal of the first transistor ($T_1$), under command of the binary selection signal (SL).

* * * * *